United States Patent
Yeh et al.

(10) Patent No.: US 12,489,027 B2
(45) Date of Patent: *Dec. 2, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Shu-Shen Yeh, Taoyuan (TW); Chin-Hua Wang, New Taipei (TW); Chia-Kuei Hsu, Hsinchu (TW); Po-Yao Lin, Zhudong Township (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/624,903

(22) Filed: Apr. 2, 2024

(65) Prior Publication Data

US 2024/0249994 A1    Jul. 25, 2024

Related U.S. Application Data

(63) Continuation of application No. 18/312,877, filed on May 5, 2023, now Pat. No. 11,973,001, which is a (Continued)

(51) Int. Cl.
  *H01L 21/48* (2006.01)
  *H01L 21/56* (2006.01)
  (Continued)

(52) U.S. Cl.
  CPC ...... *H01L 23/3675* (2013.01); *H01L 21/4853* (2013.01); *H01L 21/4857* (2013.01); (Continued)

(58) Field of Classification Search
  CPC ............. H01L 23/3675; H01L 21/4853; H01L 21/4857
  See application file for complete search history.

(56) References Cited

U.S. PATENT DOCUMENTS

| 8,604,615 B2 | 12/2013 | Lee et al. |
| 8,993,380 B2 | 3/2015 | Hou et al. |

(Continued)

FOREIGN PATENT DOCUMENTS

| CN | 108431946 A | 8/2018 |
| CN | 208690235 U | 4/2019 |

(Continued)

*Primary Examiner* — Thao P Le
(74) *Attorney, Agent, or Firm* — Slater Matsil, LLP

(57) ABSTRACT

Semiconductor devices and methods of manufacture which utilize lids in order to constrain thermal expansion during annealing are presented. In some embodiments lids are placed and attached on encapsulant and, in some embodiments, over first semiconductor dies. As such, when heat is applied, and the encapsulant attempts to expand, the lid will work to constrain the expansion, reducing the amount of stress that would otherwise accumulate within the encapsulant.

20 Claims, 21 Drawing Sheets

Related U.S. Application Data continuation of application No. 17/246,035, filed on Apr. 30, 2021, now Pat. No. 11,682,602.

(60) Provisional application No. 63/145,631, filed on Feb. 4, 2021.

(51) Int. Cl.
  *H01L 23/00* (2006.01)
  *H01L 23/31* (2006.01)
  *H01L 23/367* (2006.01)
  *H01L 23/498* (2006.01)
  *H01L 25/00* (2006.01)
  *H01L 25/065* (2023.01)

(52) U.S. Cl.
  CPC ........ *H01L 21/4871* (2013.01); *H01L 21/563* (2013.01); *H01L 21/565* (2013.01); *H01L 23/3128* (2013.01); *H01L 23/3135* (2013.01); *H01L 23/49822* (2013.01); *H01L 24/16* (2013.01); *H01L 25/0655* (2013.01); *H01L 25/50* (2013.01); *H01L 2224/16227* (2013.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,941,180 B2* | 4/2018 | Kim | H01L 23/3128 |
| 10,163,754 B2 | 12/2018 | Ho et al. | |
| 10,529,645 B2 | 1/2020 | Gandhi et al. | |
| 10,840,192 B1 | 11/2020 | Zohni et al. | |
| 10,916,488 B2 | 2/2021 | Lin et al. | |
| 11,239,136 B1 | 2/2022 | Chen et al. | |
| 12,057,359 B2* | 8/2024 | Lin | H01L 24/81 |
| 2015/0179607 A1 | 6/2015 | Ho et al. | |
| 2017/0117200 A1* | 4/2017 | Kim | H01L 24/97 |
| 2018/0145061 A1 | 5/2018 | Jeong et al. | |
| 2019/0385929 A1 | 12/2019 | Ku et al. | |
| 2020/0006274 A1 | 1/2020 | Chiang et al. | |
| 2020/0013721 A1 | 1/2020 | Chiang et al. | |
| 2020/0075436 A1 | 3/2020 | Franiatte et al. | |
| 2020/0402926 A1 | 12/2020 | Huang et al. | |
| 2021/0020538 A1 | 1/2021 | Chen et al. | |
| 2021/0020605 A1 | 1/2021 | Hiner et al. | |
| 2021/0066151 A1 | 3/2021 | Hu et al. | |
| 2021/0118756 A1 | 4/2021 | Wan et al. | |
| 2021/0225727 A1 | 7/2021 | Chen et al. | |
| 2021/0366871 A1* | 11/2021 | Ko | H01L 21/311 |
| 2021/0375711 A1 | 12/2021 | Shen et al. | |
| 2022/0157689 A1 | 5/2022 | Chen et al. | |
| 2022/0189844 A1 | 6/2022 | Hung et al. | |
| 2022/0199429 A1 | 6/2022 | Shah et al. | |
| 2022/0206221 A1 | 6/2022 | Ravichandran et al. | |
| 2022/0208713 A1 | 6/2022 | Paek et al. | |
| 2022/0208728 A1 | 6/2022 | Monadgemi | |
| 2022/0246490 A1 | 8/2022 | Yeh et al. | |
| 2022/0310482 A1 | 9/2022 | Hsiao et al. | |
| 2022/0359421 A1 | 11/2022 | Chuang et al. | |
| 2023/0115745 A1* | 4/2023 | Wang | H01L 25/0655 257/734 |
| 2023/0378152 A1 | 11/2023 | Hsu et al. | |
| 2024/0347467 A1* | 10/2024 | Lin | H01L 24/20 |
| 2024/0371742 A1* | 11/2024 | Wang | H01L 21/561 |
| 2024/0371791 A1* | 11/2024 | Wu | H01L 21/4853 |

FOREIGN PATENT DOCUMENTS

| | | |
|---|---|---|
| CN | 110620095 A | 12/2019 |
| KR | 20180058174 A | 5/2018 |
| KR | 20200002689 A | 1/2020 |
| TW | 201232750 A | 8/2012 |
| TW | 202002101 A | 1/2020 |
| TW | 202006923 A | 2/2020 |

\* cited by examiner

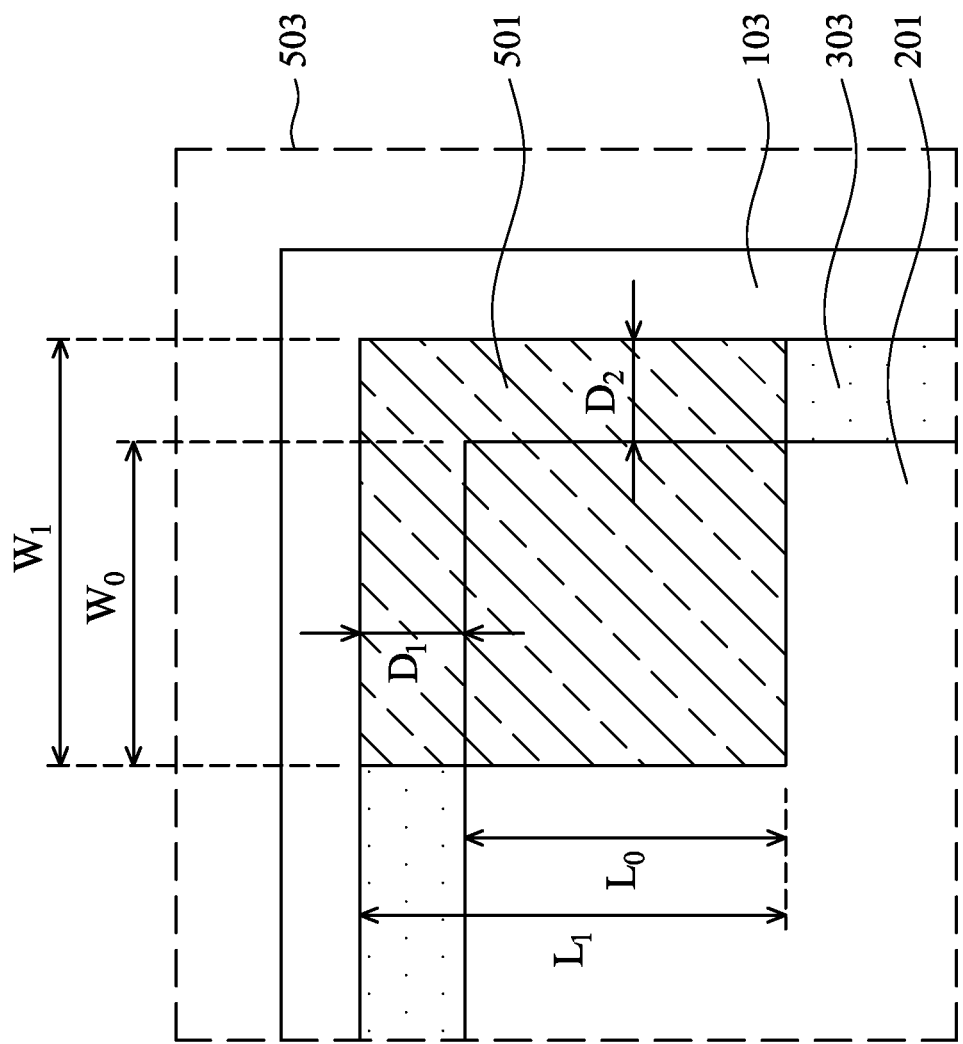

SEMICONDUCTOR DEVICE AND METHOD OF MANUFACTURE

PRIORITY CLAIM AND CROSS-REFERENCE

This application is a continuation of U.S. patent application Ser. No. 18/312,877, filed on May 5, 2023, entitled "Semiconductor Device and Method of Manufacture," which is a continuation of U.S. patent application Ser. No. 17/246,035, filed on Apr. 30, 2021, entitled "Semiconductor Device and Method of Manufacture," now U.S. Pat. No. 11,682,602, issued on Jun. 20, 2023, which claims the benefit of U.S. Provisional Application No. 63/145,631, filed on Feb. 4, 2021, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5C illustrates placement of lids, in accordance with some embodiments.

DETAILED DESCRIPTION

Figure 1:
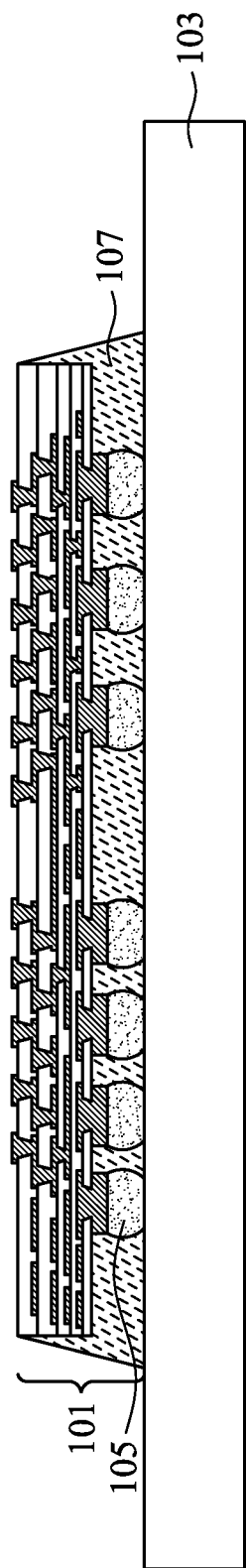
FIG. 1 illustrates an interposer bonded to a substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to one or more particular embodiments in which corners regions of a semiconductor structure are reinforced using corner lids. However, the embodiments presented herein are intended to be illustrative of the ideas presented, and are not intended to limit the ideas to the precise embodiments presented.

With reference now to FIG. 1, there is illustrated formation of an interposer 101 and a placement of the interposer 101 onto a substrate 103. In an embodiment the interposer 101 may be formed as an organic interposer with a first redistribution layer, which comprises a series of conductive layers (such as two, three or four conductive layers) embedded within a series of dielectric layers (such as four or five dielectric layers) that are utilized to provide not only conductive routing for signals, but which may also be utilized to provide structures such as integrated inductors or capacitors. In an embodiment, a first one of the series of dielectric layers is formed over, for example, a support substrate (not separately illustrated in FIG. 1), and the first one of the series of dielectric layers may be a material such as polybenzoxazole (PBO), although any suitable material, such as polyimide or a polyimide derivative, may be utilized. The first one of the series of dielectric layers may be placed using, e.g., a spin-coating process, although any suitable method may be used.

After the first one of the series of dielectric layers has been formed, openings may be made through the first one of the series of dielectric layers by removing portions of the first one of the series of dielectric layers. The openings may be formed using a suitable photolithographic mask and etching process, although any suitable process or processes may be used to pattern the first one of the series of dielectric layers.

Once the first one of the series of dielectric layers has been formed and patterned, a first one of the series of conductive layers is formed over the first one of the series of dielectric layers and through the openings formed within the first one of the series of dielectric layers. In an embodiment the first one of the series of conductive layers may be formed by initially forming a seed layer of a titanium copper alloy through a suitable formation process such as CVD or sputtering. A photoresist may then be formed to cover the seed layer, and the photoresist may then be patterned to expose those portions of the seed layer that are located where the first one of the series of conductive layers is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers has been formed, a second one of the series of dielectric layers and a second one of the series of conductive layers may be formed by repeating steps similar to the first one of the series of dielectric layers and the first one of the series of conductive layers. These steps may be repeated as desired in order to electrically connect each of the series of conductive layers to an underlying one of the series of conductive layers, and may be repeated as often as desired until an uppermost one of the series of conductive layers and an uppermost one of the series of dielectric layers has been formed. In an embodiment the deposition and patterning of the series of conductive layers and the series of dielectric layers may be continued until the first redistribution layer has a desired number of layers, although any suitable number of individual layers may be utilized.

Once the desired number of conductive layers and dielectric layers have been formed, the support substrate is removed, underbump metallizations and first external connections 105 may be formed to make electrical connection to the first one of the conductive layers. In an embodiment the underbump metallization layers may comprise three layers of conductive materials, such as a layer of titanium, a layer of copper, and a layer of nickel, formed using processes such as plating, sputtering, evaporation, PECVD process, combinations of these, or the like. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers. Any suitable materials or layers of material that may be used for the underbump metallization layers are fully intended to be included within the scope of the embodiments.

In an embodiment the first external connections 105 may be a ball grid array (BGA) which comprises a eutectic material such as solder, although any suitable materials may be used. In an embodiment in which the first external connections 105 are solder bumps, the first external connections 105 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape with a height of between about 20 μm and about 200 μm. However, any suitable processes and dimensions may be utilized.

Once the first external connections 105 have been formed, the interposer 101 may be placed on the substrate 103. The substrate 103 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Additionally, the substrate 103 at this point in the process may be part of a semiconductor wafer (the full wafer of which is not illustrated in FIG. 1) that will be singulated in a later step.

However, the substrate 103 is not intended to be limited to the embodiments described above. For example, in other embodiments the substrate 103 may include multi-layered substrates, gradient substrates, or hybrid orientation substrates, or may be a glass substrate, a ceramic substrate, a polymer substrate, a printed circuit board such as a laminate substrate formed as a stack of multiple thin layers (or laminates) of a polymer material such as bismaleimide triazine (BT), FR-4, ABF, the like, or any other substrate that may provide a suitable protection and/or interconnection functionality. These and any other suitable materials may alternatively be used for the substrate 103.

In an embodiment the interposer 101 is placed on the substrate 103 using, e.g., a pick and place process. Once in place, a reflow process may be performed in order to physically and electrically bond the interposer 101 to the substrate 103 using the first external connections 105. However, any suitable methods of placing, connecting, and bonding the interposer 101 to the substrate 103 may be utilized.

Once bonded, a first underfill 107 may be placed between the interposer 101 and the substrate 103. In an embodiment the first underfill 107 is a protective material used to cushion and support the interposer 101 and the substrate 103 from operational and environmental degradation, such as stresses caused by the generation of heat during operation. The first underfill 107 may be placed using an injection process with capillary action or may be otherwise formed in the space between the interposer 101 and the substrate 103 and may for example, comprise a liquid epoxy that is dispensed between the interposer 101 and the substrate 103 and then cured to harden.

Figure 2:
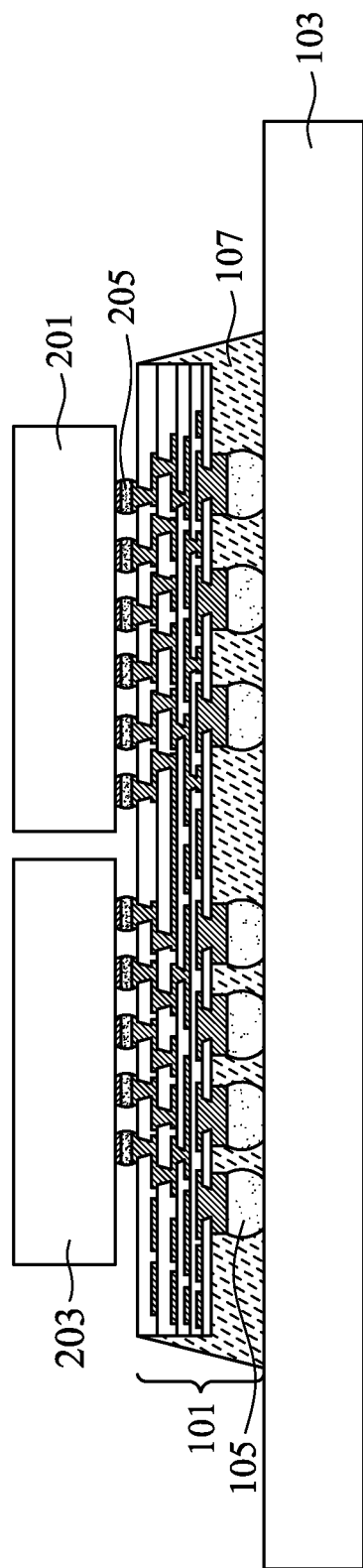
FIG. 2 illustrates placement of a first semiconductor die and a second semiconductor die on the interposer, in accordance with some embodiments.

FIG. 2 illustrates that, once the interposer 101 has been bonded to the substrate 103, a first semiconductor die 201 and a second semiconductor die 203 are bonded to the interposer 101 to form a chip-on-wafer device. In an embodiment the first semiconductor die 201 and the second semiconductor die 203 may each be system-on-chip devices, such as logic devices, that are designed in order to operate with each other to provide a desired functionality. However, any suitable functionality, or combination of functionalities, such as logic dies, central processing unit (CPU) dies, memory dies, input/output dies, combinations of these, or the like, may be utilized, and all such types are fully intended to be included within the scope of the embodiments.

In an embodiment the first semiconductor die 201 and the second semiconductor die 203, once manufactured, are placed onto the interposer 101 using, e.g., a pick and place process, to place second external connections 205 of the first semiconductor die 201 and the second semiconductor die 203 into contact with conductive portions of the interposer 101. In an embodiment the second external connections 205 may be similar to the first external connections 105, such as by being a solder material. Once in place, and in an embodiment in which the second external connections 205 are solder balls, a reflow process may be utilized in order to bond the first semiconductor die 201 and the second semiconductor die 203 to the interposer 101. However, any suitable connector and any suitable process may be utilized.

Figure 3:
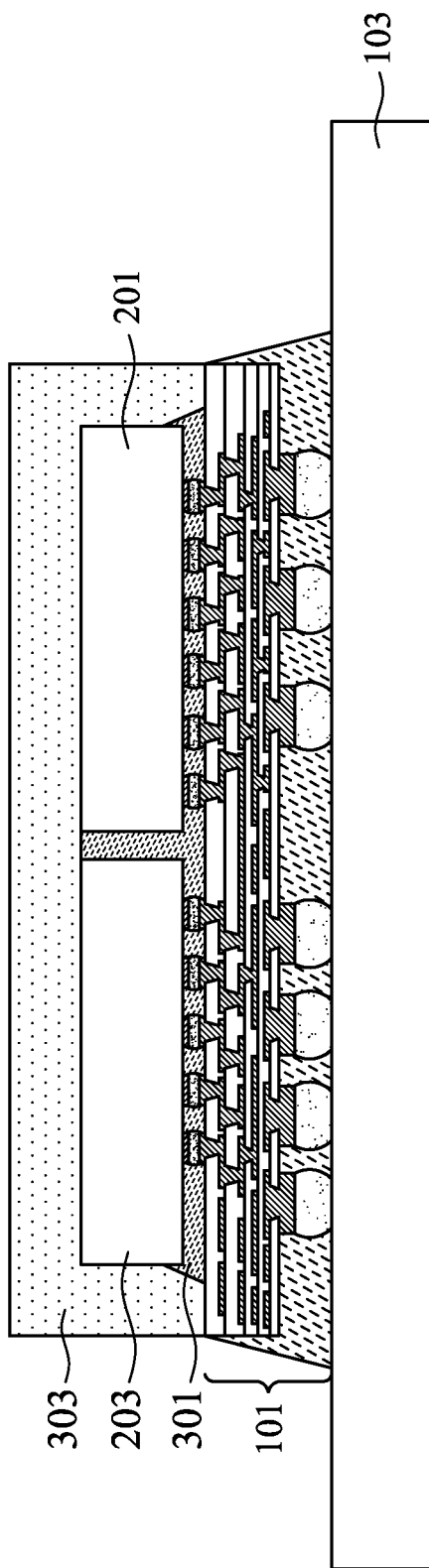
FIG. 3 illustrates an encapsulation of the first semiconductor die and the second semiconductor die with an encapsulant, in accordance with some embodiments.

FIG. 3 illustrates that, once the first semiconductor die 201 and the second semiconductor die 203 are in place, a second underfill 301 may be placed and a encapsulant 303 may be utilized to encapsulate the first semiconductor die 201, the second semiconductor die 203, and a portion of the interposer 101. In an embodiment the second underfill 301 may be similar to the first underfill 107 described above with respect to FIG. 1. For example, the second underfill 301 may be a liquid epoxy placed using capillary action. However, any suitable material and method of placement may be utilized.

However, with respect to the second underfill 301, the second underfill 301 is not dispensed solely between the interposer 101 and the first semiconductor die 201 and between the interposer 101 and the second semiconductor die 203. In addition, the second underfill 301 may be dispensed such that the second underfill 301 is located between the first semiconductor die 201 and the second semiconductor die 203. In some embodiments the second underfill 301 fills the entire area between the first semiconductor die 201 and the second semiconductor die 203, while in other embodiments the second underfill 301 fills a portion of the area between the first semiconductor die 201 and the second semiconductor die 203. Any suitable dispersal may be utilized.

Once the second underfill 301 has been dispensed, the encapsulant 303 is disposed to encapsulate the first semiconductor die 201, the second semiconductor die 203, and the second underfill 301. The encapsulation may be performed in a molding device (not illustrated in FIG. 3), which may comprise a top molding portion and a bottom molding portion separable from the top molding portion. When the top molding portion is lowered to be adjacent to the bottom molding portion, a molding cavity may be formed for the first semiconductor die 201 and the second semiconductor die 203.

During the encapsulation process the top molding portion may be placed adjacent to the bottom molding portion, thereby enclosing the first semiconductor die 201 and the second semiconductor die 203 within the molding cavity. Once enclosed, the top molding portion and the bottom molding portion may form an airtight seal in order to control the influx and outflux of gasses from the molding cavity. Once sealed, an encapsulant 303 may be placed within the molding cavity. The encapsulant 303 may be a molding compound resin such as polyimide, PPS, PEEK, PES, a heat resistant crystal resin, combinations of these, or the like. The encapsulant 303 may be placed within the molding cavity prior to the alignment of the top molding portion and the bottom molding portion, or else may be injected into the molding cavity through an injection port.

Once the encapsulant 303 has been placed into the molding cavity such that the encapsulant 303 encapsulates the first semiconductor die 201 and the second semiconductor die 203, the encapsulant 303 may be cured in order to harden the encapsulant 303 for optimum protection. While the exact curing process is dependent at least in part on the particular material chosen for the encapsulant 303, in an embodiment in which molding compound is chosen as the encapsulant 303, the curing could occur through a process such as heating the encapsulant 303 to between about 100° C. and about 130° C., such as about 125° C. for about 60 sec to about 3000 sec, such as about 600 sec. Additionally, initiators and/or catalysts may be included within the encapsulant 303 to better control the curing process.

However, as one having ordinary skill in the art will recognize, the curing process described above is merely an exemplary process and is not meant to limit the current embodiments. Other curing processes, such as irradiation or even allowing the encapsulant 303 to harden at ambient temperature, may also be used. Any suitable curing process may be used, and all such processes are fully intended to be included within the scope of the embodiments discussed herein.

Figure 4:
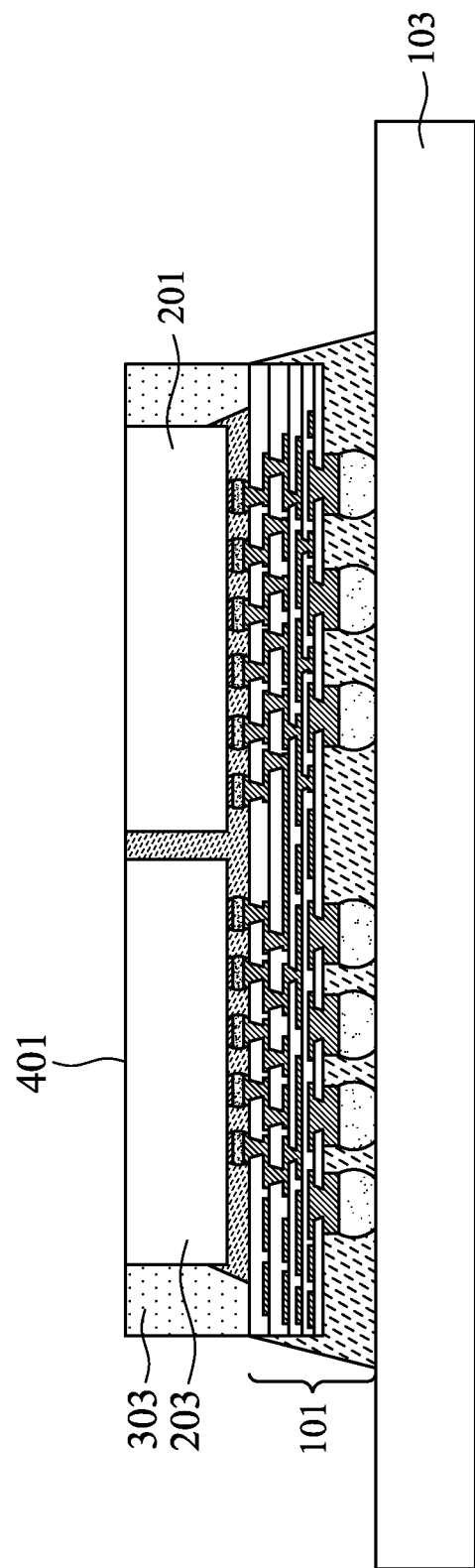
FIG. 4 illustrates a thinning of the encapsulant, in accordance with some embodiments.

FIG. 4 illustrates that, once the encapsulant 303 has been placed, the encapsulant 303 may be thinned in order to expose the first semiconductor die 201 and the second semiconductor die 203, and to create a first surface 401 which comprises each of the encapsulant 303, the first semiconductor die 201 and the second semiconductor die 203. The thinning may be performed, e.g., using a mechanical grinding or chemical mechanical polishing (CMP) process whereby chemical etchants and abrasives are utilized to react and grind away the encapsulant 303, the first semiconductor die 201 and the second semiconductor die 203 until the first semiconductor die 201 and the second semiconductor die 203 have been exposed. As such, the first semiconductor die 201 and the second semiconductor die 203 may have a planar surface that is also planar with the encapsulant 303.

However, while the CMP process described above is presented as one illustrative embodiment, it is not intended to be limiting to the embodiments. Any other suitable removal process may be used to thin the encapsulant 303, the first semiconductor die 201 and the second semiconductor die 203. For example, a series of chemical etches may be utilized. This process and any other suitable process may be utilized to thin the encapsulant 303, the first semiconductor die 201, and the second semiconductor die 203, and all such processes are fully intended to be included within the scope of the embodiments.

Figure 5A:
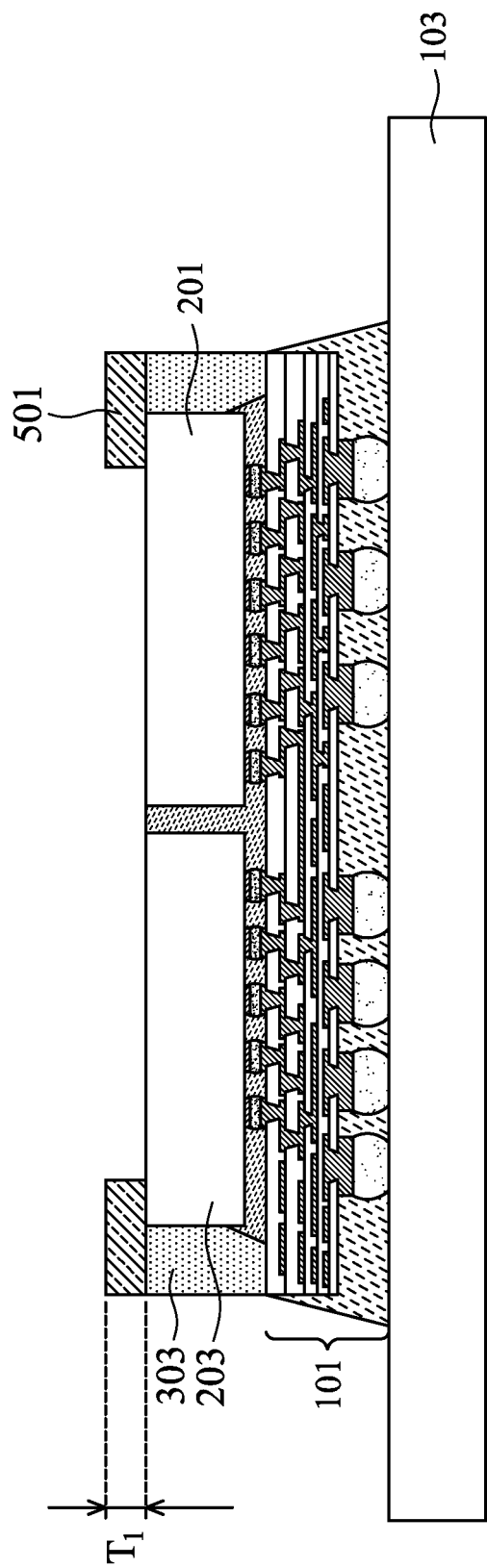
Figure 5B:
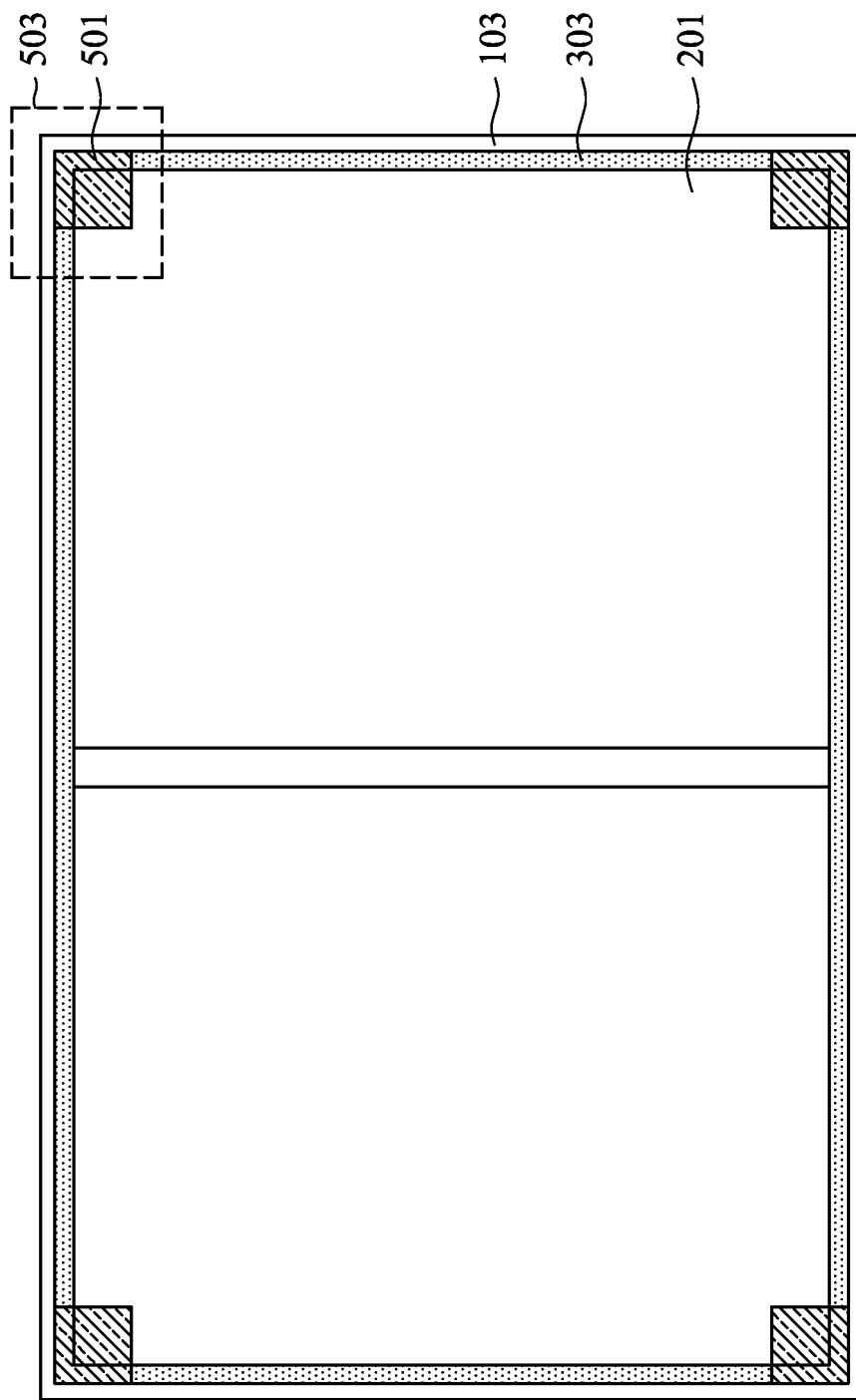

FIGS. 5A-5C illustrate placement of lids 501, or islands, on the first surface 401 (e.g., the surface comprising the encapsulant 303, the first semiconductor die 201, and the second semiconductor die 203), along corners of a first intersection between the first semiconductor die 201 and the encapsulant 303, and along corners of a second intersection between the second semiconductor die 203 and the encapsulant 303. With respect to these figures, FIG. 5B illustrates a top down view of the structure illustrated in cross-section in FIG. 5A. Additionally, FIG. 5C illustrates a close-up, zoomed in view of the section illustrated by the dashed line labeled 503 in FIG. 5B.

In an embodiment the lids 501 are placed in order to provide additional structural support during heating processes between the encapsulant 303 and the first semiconductor die 201 and the second semiconductor die 203. As such, the lids 501 may be made of a support material that has a first coefficient of thermal expansion that is less than a second coefficient of thermal expansion of the encapsulant 303. For example, in a particular embodiment, the lids 501 may be a metal such as copper, stainless steels (e.g., SUS304, SUS430, etc.), combinations of these or the like. However, any suitable material may be utilized.

In an embodiment the lids 501 may be placed using, e.g., a pick and place process so that the lids 501 cross and cover portions of one or more interfaces between the underlying structures (e.g., cover portions of interfaces between the encapsulant 303 and the first semiconductor die 201). As such, the encapsulant 303, the first semiconductor die 201 and the lids 501 share a single interface.

Additionally, the lids 501 may be attached to the underlying structures (e.g., the first semiconductor die 201 and the encapsulant 303) using a thermal interface material (TIM) (not separately illustrated in FIGS. 5A-5C). In an embodiment the thermal interface material may be a viscous, silicone compound similar to the mechanical properties of a grease or a gel (e.g., 993-TC), wherein the thermal interface material may have a thermal conductivity (i.e., "k value") in Watts per meter-Kelvin (W/mK) of between about 1 W/mK and about 10 W/mK, such as about 4 W/mK, for example. In other embodiments, the thermal interface material is a metal-based thermal paste containing silver, nickel, or aluminum particles suspended in the silicone grease. In still other embodiments non-electrically conductive, ceramic-based pastes, filled with ceramic powders such as beryllium oxide, aluminum nitride, aluminum oxide, or zinc oxide, may be applied.

In embodiments in which a gel or paste consistency is not desired, instead of being a paste with a consistency similar to gels or greases, the thermal interface material may instead be a hard-type, solid material. In this embodiment the thermal interface material may be a thin sheet of a thermally conductive, solid material. In a particular embodiment the thermal interface material that is solid may be a thin sheet of indium, nickel, silver, aluminum, combinations and alloys of these, or the like, or other thermally conductive solid material (e.g., X23-8018-33). Any suitably thermally conductive material (e.g., 8099-HB) may also be utilized, and all such materials are fully intended to be included within the scope of the embodiments.

The lids 501 may be placed in a corner of the encapsulant 303 so that the lids 501 cover at least a portion of the intersection between the first semiconductor die 201 and the encapsulant 303. As such, in this embodiment, each of the lids 501 may be aligned with the encapsulant 303 along at least two edges of the encapsulant 303. However, any suitable placement may be utilized.

In some embodiments the lids 501 may be shaped as a square with a first thickness $T_1$, a first width $W_1$ and a first length $L_1$. In an embodiment the first thickness $T_1$ may be between about 50 µm and about 500 µm. However, any suitable thickness may be utilized.

Looking next at the first width $W_1$, and with respect to FIG. 5C, the first width $W_1$ may be less than the width of the first semiconductor die 201. For example, the first width $W_1$ may be between about 3 mm and about 4 mm. However, any suitable width may be utilized.

Additionally, the first length $L_1$ may be less than a length of the first semiconductor die 201. For example, the first length $L_1$ may be between about 3 mm and about 4 mm. However, any suitable dimensions may be utilized.

Additionally in this embodiment, the lids 501 may overlap the first semiconductor die 201 by a first overlap length $L_O$ and first overlap width $W_O$. In an embodiment the first overlap length $L_O$ may be less than the length of the first semiconductor die 201, such as being between about 2 mm and about 3 mm, and the first overlap width $W_O$ may be less than the width of the first semiconductor die 201, such as being between about 2 mm and about 3 mm. However, any suitable length and width may be utilized.

As illustrated, in this embodiment the lids 501 may cover a portion of the encapsulant 303 which extends away from the first semiconductor die 201. In an embodiment this portion of the encapsulant 303 may extend a first distance $D_1$ that may be less than the length of the first semiconductor die 201, and in particular embodiments the first distance $D_1$ may be less than about one-third of the length of the first semiconductor die 201. For example, the first distance $D_1$ may be between about 400 µm and about 1000 µm. However, any suitable dimension may be utilized.

Similarly, on a second side of the first semiconductor die 201, the lids 501 may cover another portion of the encapsulant 303 which extends away from the first semiconductor die 201. In an embodiment this portion of the encapsulant 303 may extend a second distance $D_2$ that may be less than the width of the first semiconductor die 201, and in particular embodiments the second distance $D_2$ may be less than about one-third of the width of the first semiconductor die 201. For example, the second distance $D_2$ may be between about 400 µm and about 1000 µm. However, any suitable dimension may be utilized.

By placing the lids 501 as described the lids 501 can help protect and support the underlying structures during subsequent processing. In particular, by using a material that has a smaller coefficient of thermal expansion and by placing the lids 501 as described, the material of the lids 501 helps to constrain and suppress any expansion of the encapsulant 303 during subsequent processing and operations when heat may be applied and/or generated. As such, the stress at the corner can be reduced by the presence of the lids 501.

Figure 6:
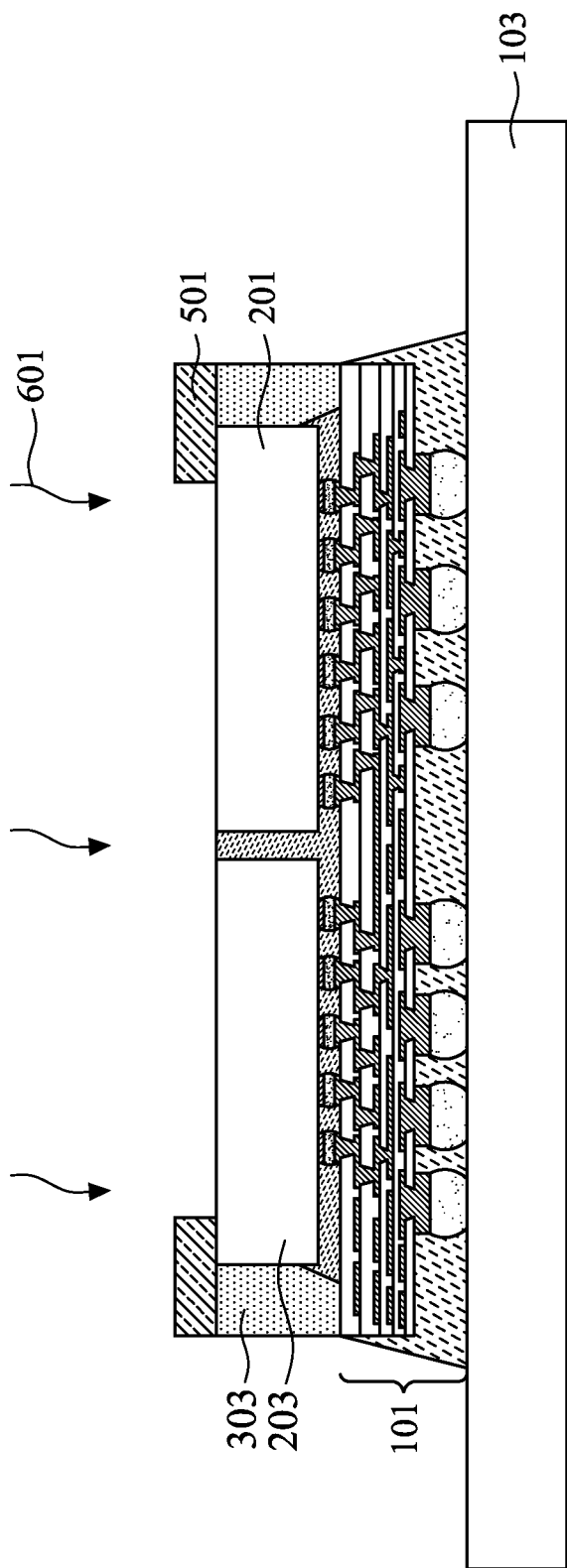
FIG. 6 illustrates a first annealing process, in accordance with some embodiments.

FIG. 6 illustrates a first annealing process (represented in FIG. 6 by the wavy lines labeled 601) that can be utilized to help cure or further cure the first underfill 107, the second underfill 301, and the encapsulant 303. In an embodiment the first annealing process 601 may be a furnace annealing process, whereby the structure is placed into a furnace and is surrounded by an inert environment. In an embodiment the inert environment may be an inert gas such as argon, neon, or the like, or else may be an environment which is non-reactive to the exposed surfaces. Once the structure is within the furnace, the furnace will use heating elements to raise the temperature of the inert environment and, thus raise the temperature of the encapsulant 303 and other structures.

In an embodiment, the first annealing process 601 may raise the temperature to be between about −55° C. and about 260° C. Additionally, the first annealing process 601 may be performed for a time of between about 60 seconds and about 3600 seconds. However, any suitable time and temperature may be utilized.

Additionally, while a furnace annealing process is described above as one embodiment of the first annealing process 601, this is intended to be illustrative and is not intended to be limiting in any fashion. Rather, any suitable annealing process, such as rapid thermal anneals, flash anneals, laser anneals, combinations of these, or the like, may also be used. Any suitable method of annealing may be utilized, and all such methods are fully intended to be included within the scope of the embodiments.

Figure 7A:
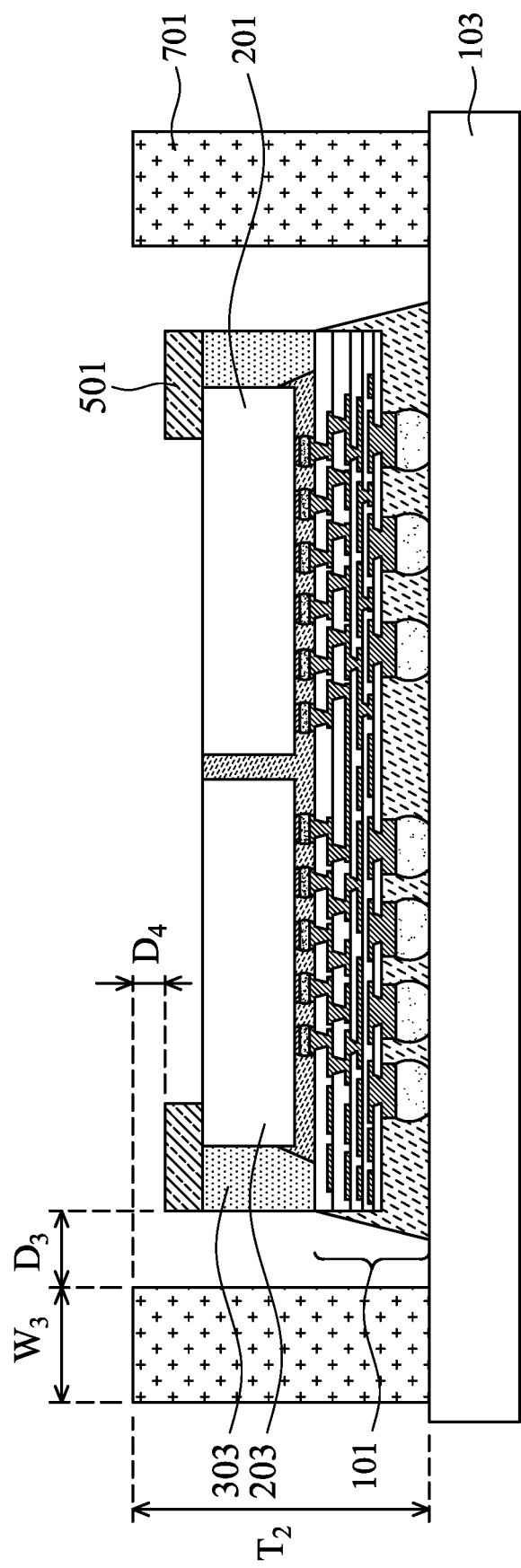
FIGS. 7A-7B illustrate placement of a ring, in accordance with some embodiments.
Figure 7B:
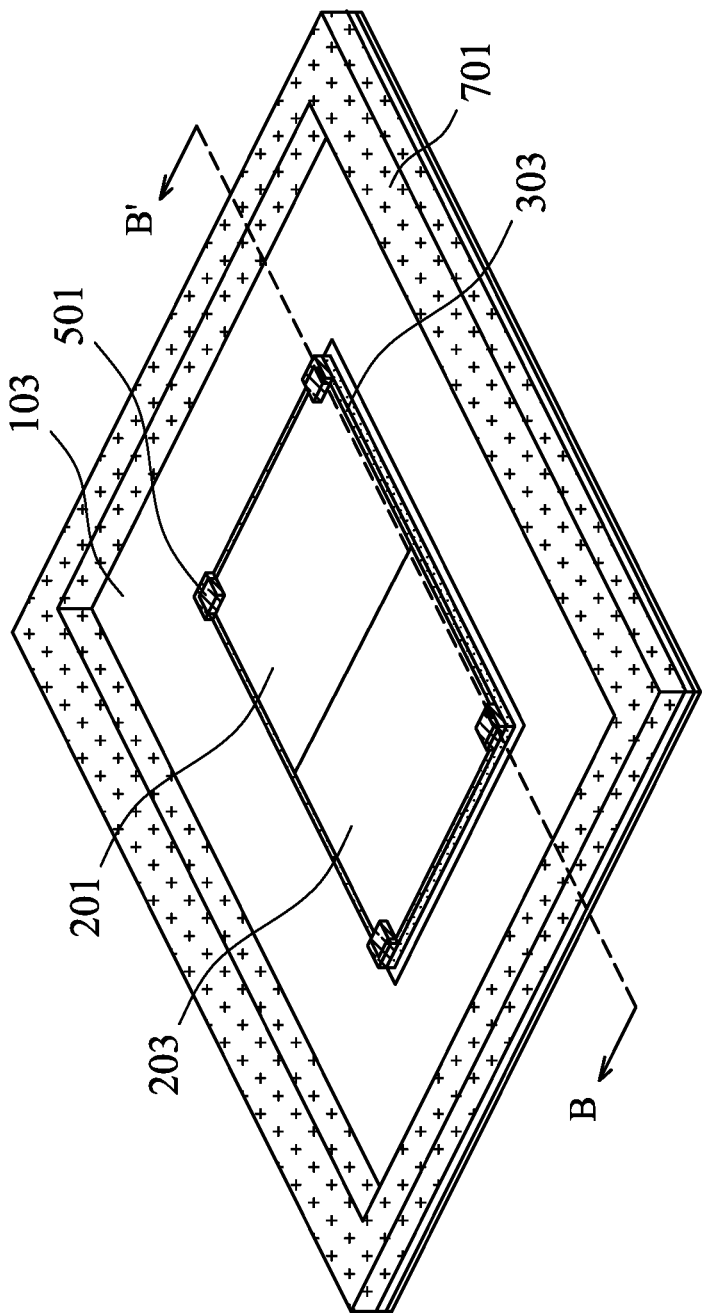

FIGS. 7A-7B illustrate that, once the first annealing process 601 has been completed, a ring 701, such as a stiffening ring, is placed on the substrate 103. In these figures, FIG. 7B illustrates an isometric view of the structure illustrated in cross-section in FIG. 7A along line B-B'. In an embodiment the ring 701 is used to provide additional support to the substrate 103 during subsequent manufacturing and usage.

In an embodiment the ring 701 may be placed so that the ring 701 is laterally separated from the encapsulant 303 by a third distance $D_3$ and also extends to encircle the encapsulant 303 forming a cavity. In an embodiment the third distance $D_3$ may be between about 3 mm and about 10 mm. Further, while the lateral separation between the ring 701 and the encapsulant 303 may be equidistant around each side of the encapsulant 303 in some embodiments, in other embodiments, the lateral separation may be different around each side of the encapsulant 303. However, any suitable dimensions and/or combination of dimensions may be utilized.

In an embodiment the ring 701 may comprise a metal such as copper, although any other suitable metal, such as aluminum or the like, may also be used. Similarly, dielectric materials, such as silicone, may also be utilized. Additionally, the ring 701 may be attached utilizing an adhesive (not separately illustrated) such as an epoxy, glue, polymeric material, solder paste, thermal adhesive, or the like, and may be a thermally conductive material and/or may contain thermally conductive particles. However, any suitable material and any suitable method of attachment may be utilized.

In an embodiment the ring 701 may be placed on the substrate 103 and may have a third width $W_3$ of between about 1 mm and about 30 mm. Additionally, the ring 701 may have a second thickness $T_2$ of between about 0.1 mm and about 3 mm, which is larger than a combined thickness of the interposer 101, the encapsulant 303, and the lids 501 such that the ring 701 extends beyond the lids 501 a fourth distance $D_4$ of between about 0 mm and about 2.9 mm. However, any suitable dimensions may be utilized.

Figure 8A:
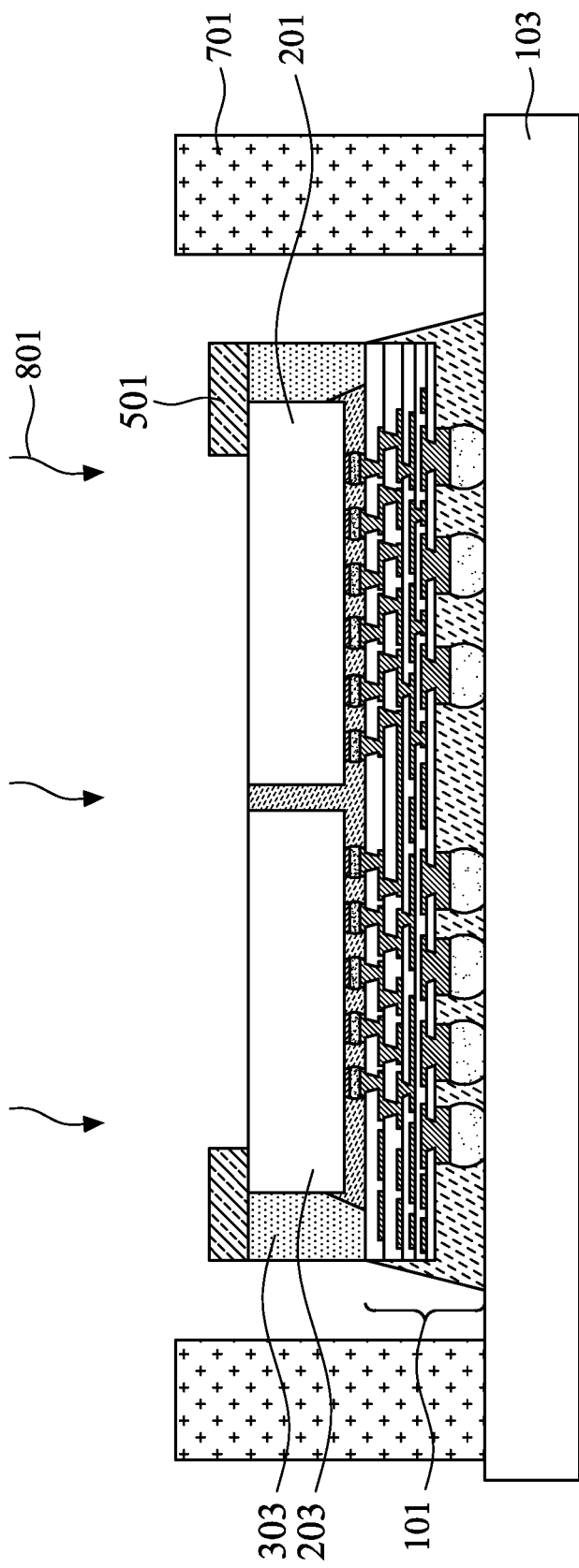
FIGS. 8A-8B illustrate a second annealing process, in accordance with some embodiments.
Figure 8B:
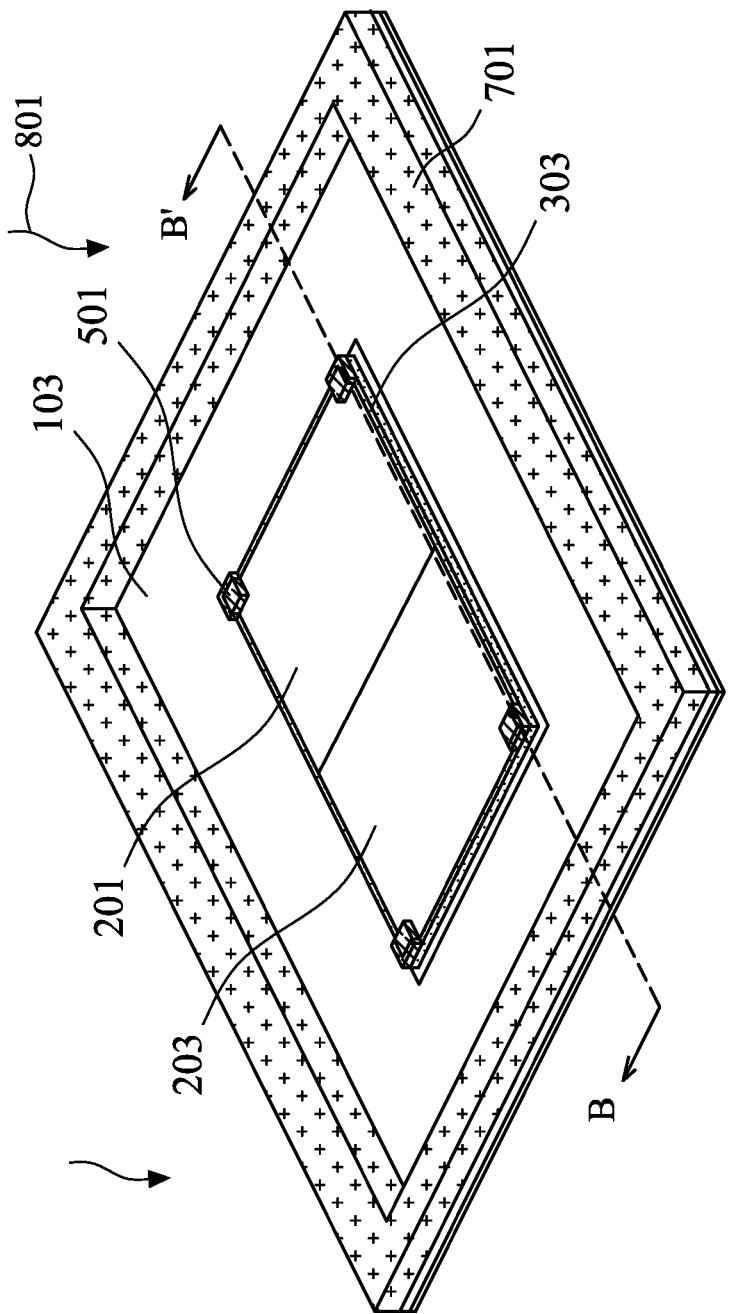

FIGS. 8A-8B illustrate that, once the ring 701 has been placed, a second annealing process (represented in FIG. 8A by the wavy lines labeled 801) may be performed in order to cure the device. In these figures, FIG. 8B illustrates an isometric view of the structure illustrated in cross-section in FIG. 8A along line B-B'. In an embodiment the second annealing process 801 may be similar to the first annealing process 601 described above with respect to FIG. 6, such as by being a furnace anneal. However, the second annealing process 801 may be performed at a temperature of between about −55° C. and about 260° C. for a time of between about 60 seconds and about 3600 seconds, although any suitable temperature and annealing process may be utilized.

However, by placing the lids 501 onto the encapsulant 303 and the first semiconductor die 201 (or the second semiconductor die 203), the lids 501 are in place to help restrict and reduce the stresses that can build up when the encapsulant 303 becomes heated. In particular, by having a lower coefficient of thermal expansion than the adjacent materials, the lids 501 can help restrain the expansion of the surrounding material. This restraint of the expansion helps to prevent stresses from building up and causing defects within the structure, helping to increase efficiencies and yields.

Figure 9:
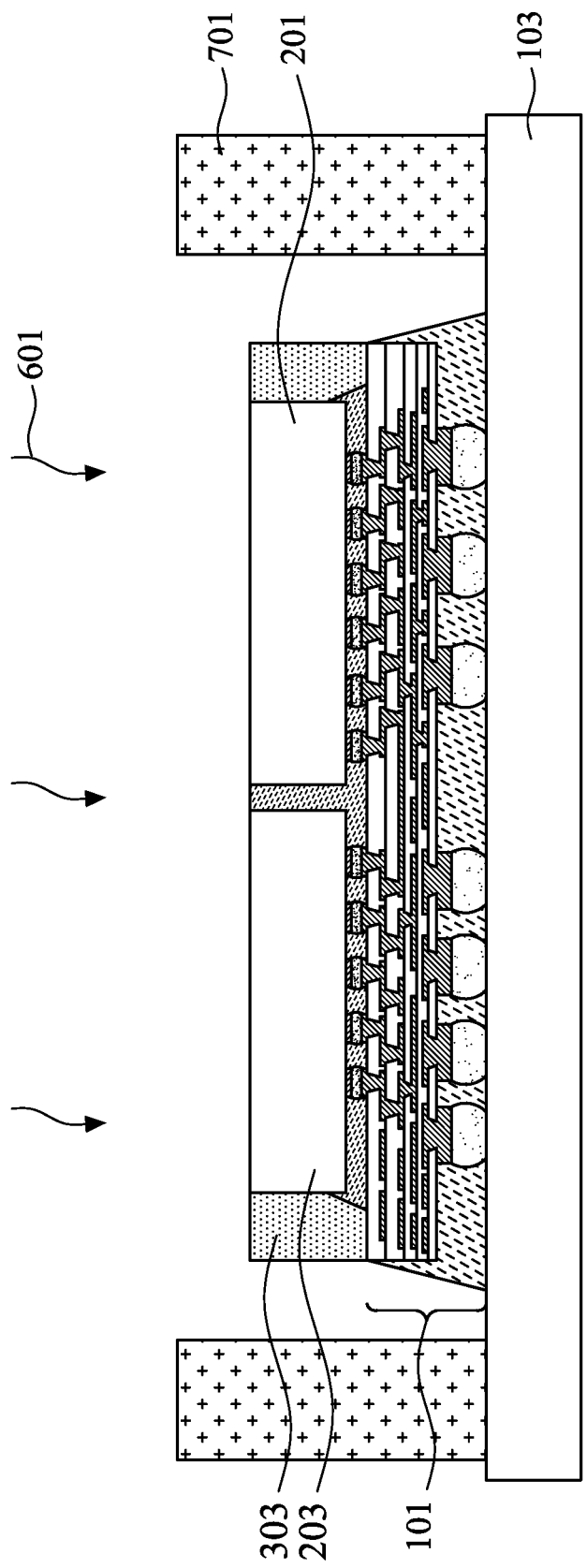
FIG. 9 illustrates a placement of the ring prior to placement of the lids, in accordance with some embodiments.

FIG. 9 illustrates another embodiment in which the ring 701 is placed onto the substrate 103 prior to the placement of the lids 501. In this embodiment, after the encapsulant 303 has been thinned in order to expose the first semiconductor die 201 and the second semiconductor die 203, the ring 701 is placed as described above with respect to FIG. 7. For example, the ring 701 may be placed with a suitable adhesive, although any method of placing the ring 701 may be utilized.

FIG. 9 additionally illustrates that, once the ring 701 has been placed and prior to placement of the lids 501, the first annealing process 601 is performed. In an embodiment the first annealing process 601 may be performed as described above with respect to FIG. 6. However, any suitable annealing process may be utilized.

In another embodiment, once the ring 701 has been placed and prior to any placement of the lids 501, the second annealing process 801 is performed at this point instead of the first annealing process 601. As such, any of the described annealing processes may be utilized once the ring 701 has been placed and prior to the placement of the lids 501.

Figure 10:
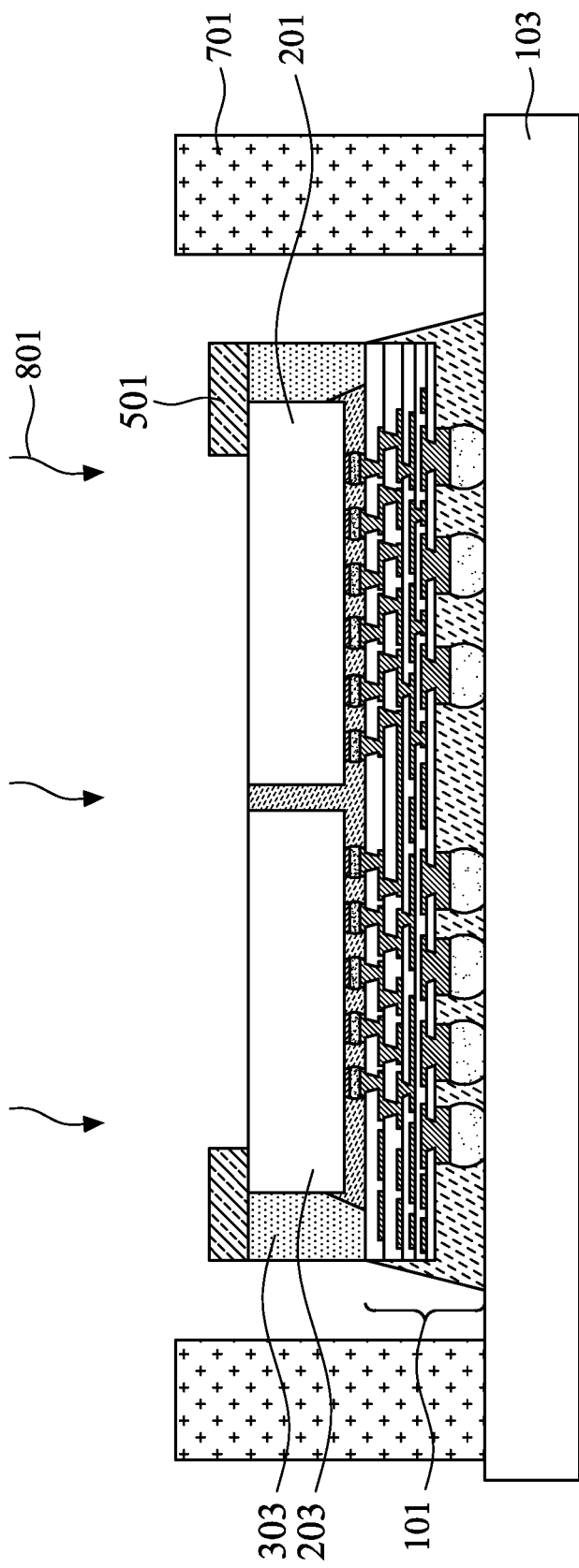
FIG. 10 illustrates a placement of the lids after placement of the ring, in accordance with some embodiments.

Once a first one of the first annealing process 601 or the second annealing process 801 is performed, FIG. 10 illustrates that the lids 501 may be placed onto the encapsulant 303, the first semiconductor die 201, and the second semiconductor die 203. In an embodiment the lids 501 may be placed as described above with respect to FIG. 5. For example, the lids 501 may be placed using, e.g., a pick-and-place process at the corners of the encapsulant 303. However, any suitable method of placing the lids 501 may be utilized.

FIG. 10 additionally illustrates that, once the lids 501 have been placed, the second one of the first annealing process 601 or the second annealing process 801 (e.g., the annealing process that was not performed prior to the placement of the lids 501) may be performed. For example, when the first annealing process 601 was previously performed, the second annealing process 801 may be performed as described above with respect to FIG. 8A. As another example, when the second annealing process 801 was previously performed, the first annealing process 601 is performed. However, any suitable annealing process may be utilized.

By rearranging the process steps (e.g., placement of the lids 501, placement of the ring 701, the first annealing process 601, the second annealing process 801, etc.), the manufacturing process may be modified while still obtaining the benefits of reduced stresses. In particular, the lids 501 may still be utilized to restrain the expansion of the encapsulant 303 (and other adjacent materials). However, a more flexible manufacturing process may be achieved.

Figure 11:
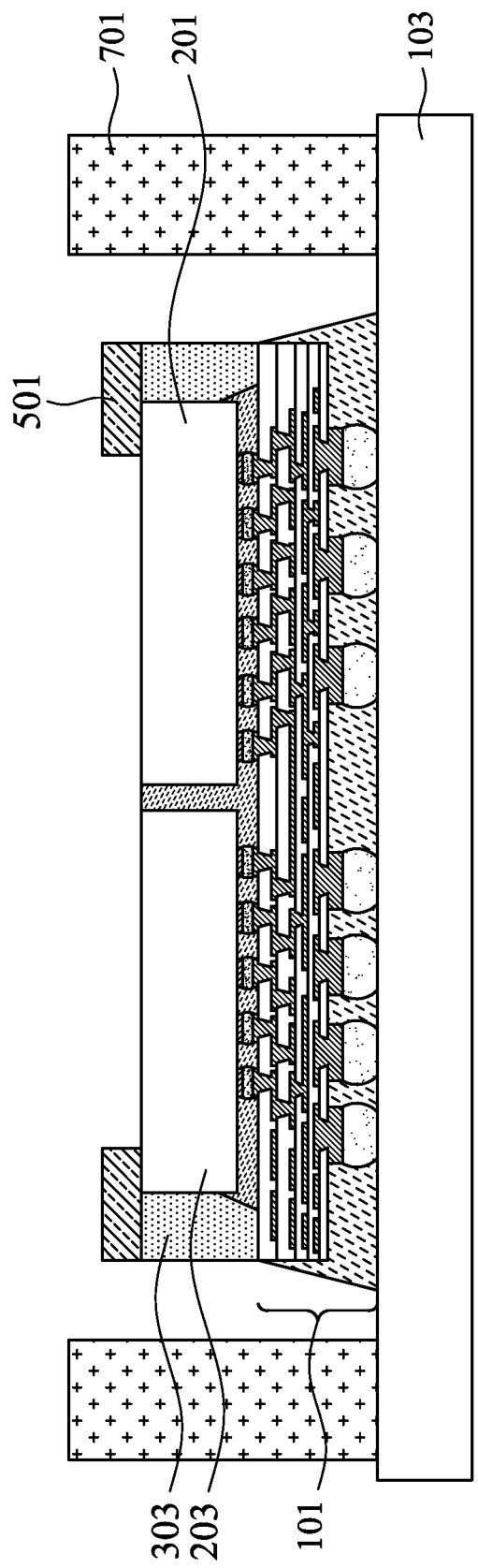
FIG. 11 illustrates a placement of the lids and the ring prior to annealing, in accordance with some embodiments.

FIG. 11 illustrates another embodiment which utilizes both the ring 701 as well as the lids 501 are utilized. In this embodiment, however, instead of utilizing both the first annealing process 601 and the second annealing process

801, a single third annealing process 1201 (not illustrated in FIG. 11 but illustrated and discussed further below with respect to FIG. 12) is utilized in order to cure the encapsulant 303.

In this embodiment, the lids 501 are placed onto the encapsulant 303 and the ring 701 is placed on the substrate 103 prior to any annealing process being used to cure the structure including the encapsulant 303. For example, the lids 501 may be placed as described above with respect to FIG. 5, and the ring 701 may be placed as described above with respect to FIG. 7. However, any suitable processes may be utilized.

Figure 12:
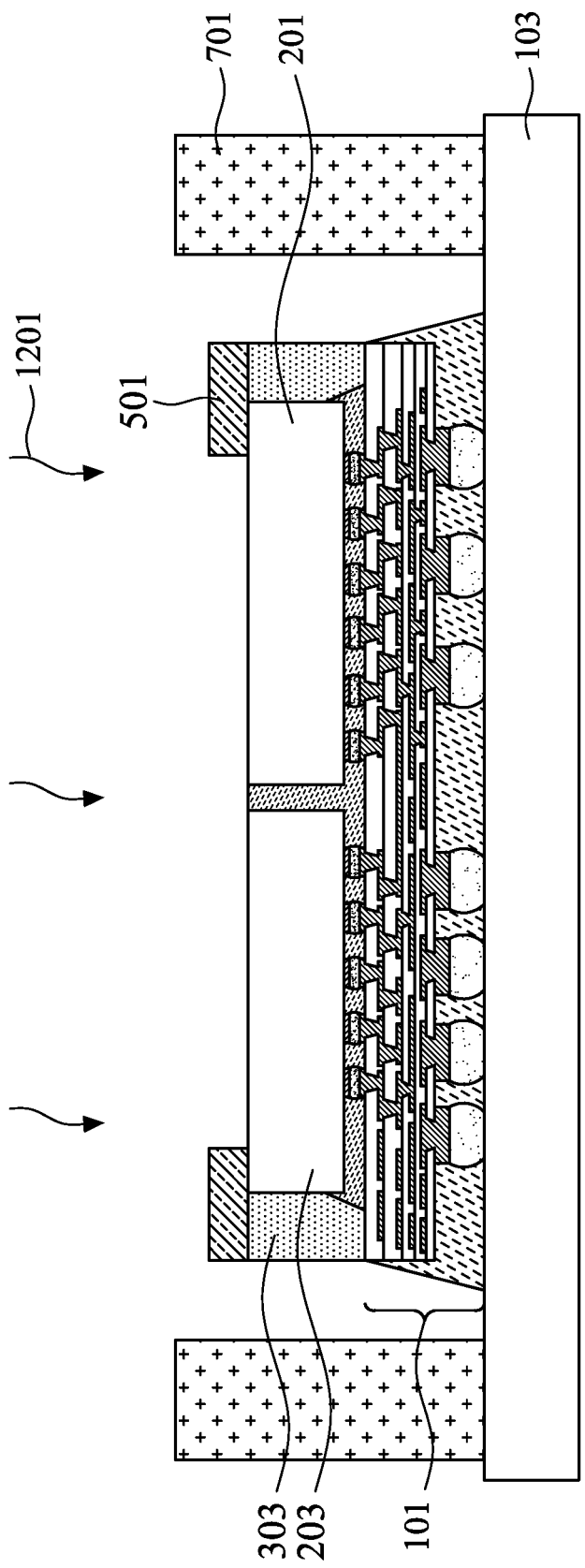
FIG. 12 illustrates a third annealing process, in accordance with some embodiments.

FIG. 12 illustrates that, once both the lids 501 and the ring 701 have been placed, the third annealing process 1201 (represented in FIG. 12 by the wavy lines labeled 1201) may be performed. In an embodiment the third annealing process 1201 may be an annealing process similar to either the first annealing process 601 or the second annealing process 801, such as a furnace annealing process. In an embodiment, however, the third annealing process 1201 may be performed at a temperature of between about −55° C. and about 260° C. Additionally, the third annealing process 1201 may be performed for a time of between about 60 seconds and about 3600 seconds. However, any suitable time and temperature may be utilized.

By placing the ring 701 and the lids 501 prior to any annealing processes, the use of two anneals (e.g., the first annealing process 601 and the second annealing process 801) may be consolidated into a single annealing process (e.g., the third annealing process 1201). As such, the manufacturing process may be simplified while still obtaining the benefits of the encapsulant 303, the lids 501, and the ring 701.

FIGS. 13A-13G illustrates other embodiments that may be utilized for the lids 501 instead of the square embodiment described above with respect to FIGS. 5A-5C. Each of these embodiments illustrates that the lids 501 may be any suitable shape and size as long as the lids 501 cover portions of both the first semiconductor die 201 (or the second semiconductor die 203) and the encapsulant 303 at a corner, even though no particular point needs to be covered.

Figure 13A:
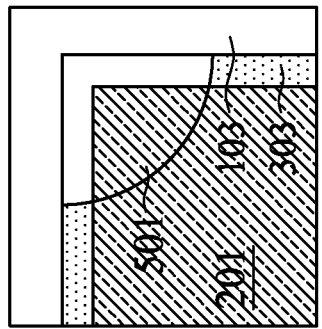
FIGS. 13A-13G illustrate various shapes and placements for the lids, in accordance with some embodiments.

Looking first at FIG. 13A, in this embodiment the lid 501 is in the shape of a triangle. Additionally, the triangle is located such that two sides of the triangle are aligned with two sides of the encapsulant 303 while still having the lid 501 extend at least partially over a portion of the first semiconductor die 201. However, any suitable placement may be utilized.

Figure 13B:
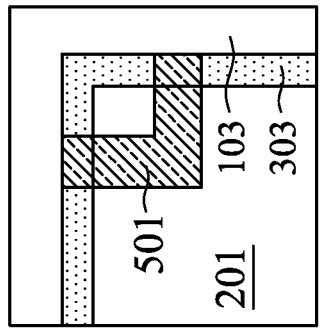

FIG. 13B illustrates an embodiment in which the lid 501 is placed in a corner region but does not cover the exact corner of either the first semiconductor die 201 or the encapsulant 303. In this embodiment the lid 501 may be shaped as an "L," wherein opposite, short ends of the "L" shape are aligned with different sides of the encapsulant 303, while longer ends of the "L" shape extend at least partially over the first semiconductor die 201. By using the "L" shape, the lid 501 may still restrain expansion of the encapsulant 303 while not covering the corner region. However, any suitable placement may be utilized.

Figure 13C:
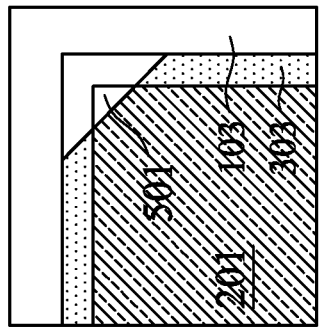

FIG. 13C illustrates an embodiment in which the lid 501 is shaped as a quarter-circle. In this embodiment the straight sides of the lid 501 are aligned with sidewalls of the encapsulant 303 and also cover the corner region of the encapsulant 303. Additionally, a curved side of the lid 501 extends across the encapsulant 303 and also extends over at least a portion of the first semiconductor die 201. However, any suitable placement may be utilized.

Figure 13D:
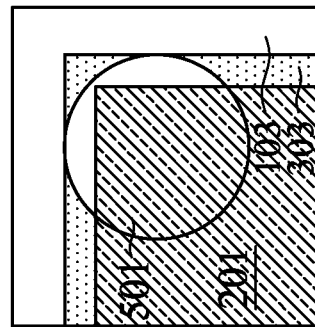

FIG. 13D illustrates an embodiment in which the lid 501 is a polygon. In this embodiment, the polygon has five or greater sides (with an embodiment with five sides illustrated), and in which each side is straight. In such an embodiment two of the sides of the lid 501 may be aligned with the underlying encapsulant 303, and three or more sides may extend to be at least partially located over the first semiconductor die 201. Additionally, one or more of the straight sides are located fully over the first semiconductor die 201. However, any suitable number of sides and any suitable location may be utilized.

Figure 13E:
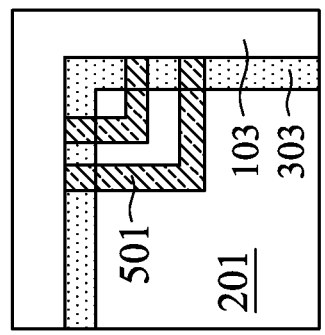

FIG. 13E illustrates another embodiment in which the lid 501 has an "L" shape. In this embodiment, however, the "L" shape covers the corners of both the first semiconductor die 201 and the encapsulant 303. As such, long sides of the "L" shape may be aligned with sides of the encapsulant 303, while short sides extend to be located at least partially over the first semiconductor die 201. However, any suitable location may be utilized.

Figure 13F:
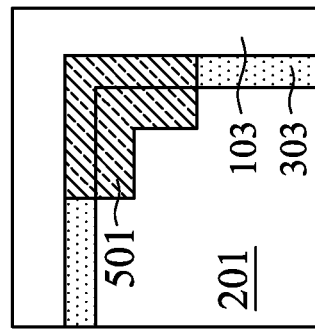

FIG. 13F illustrates yet another embodiment in which the lid 501 has the "L" shape as described above with respect to FIG. 13B. In this embodiment, however, the lid 501 is separated into multiple, distinct "L" shapes, wherein each of the multiple, distinct "L" shapes are separated from each other by a first space. However, any suitable number of "L" shapes may be separated by any suitable distance.

Figure 13G:
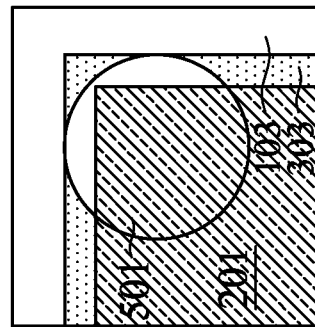

FIG. 13G illustrates an embodiment in which the lid 501, instead of being a quarter-circle, is a full circle. In this embodiment, while the lid 501 has multiple points that are located over an edge of the encapsulant 303, the corner of the encapsulant 303 remains uncovered. Additionally, the lid 501 continues to curve away from the edges of the encapsulant 303 and extends at least partially over the first semiconductor die 201. However, any suitable placement may be utilized.

Figure 14:
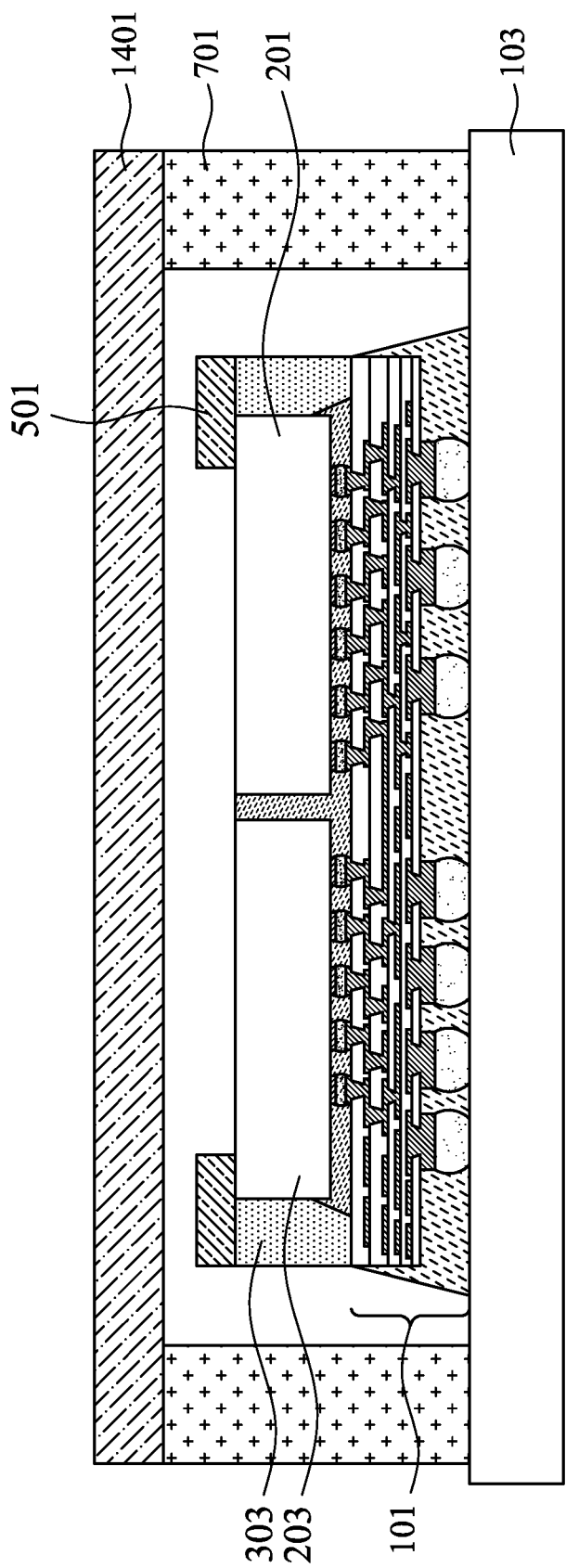
FIG. 14 illustrates the placement of a lid, in accordance with some embodiments.

FIG. 14 illustrates the placement of an optional second lid 1401 over the first semiconductor die 201 and the second semiconductor die 203. In an embodiment the second lid 1401 may be used for heat dissipation and may be, for example, a heat exchanger, a vapor chamber lid, combinations of these, or the like. In some embodiments the second lid 1401 may comprise copper, aluminum, other metals, alloys, combinations thereof, or other materials of high electrical and/or thermal conductivities.

Additionally, the second lid 1401 may be sealed to the ring 701. For example, the second lid 1401 may be sealed to the ring 701 using a heat clamping method, whereby pressure and heat are applied in order to seal the second lid 1401 to the ring 701. However, any suitable method of sealing the second lid 1401 may be utilized.

Figure 15:
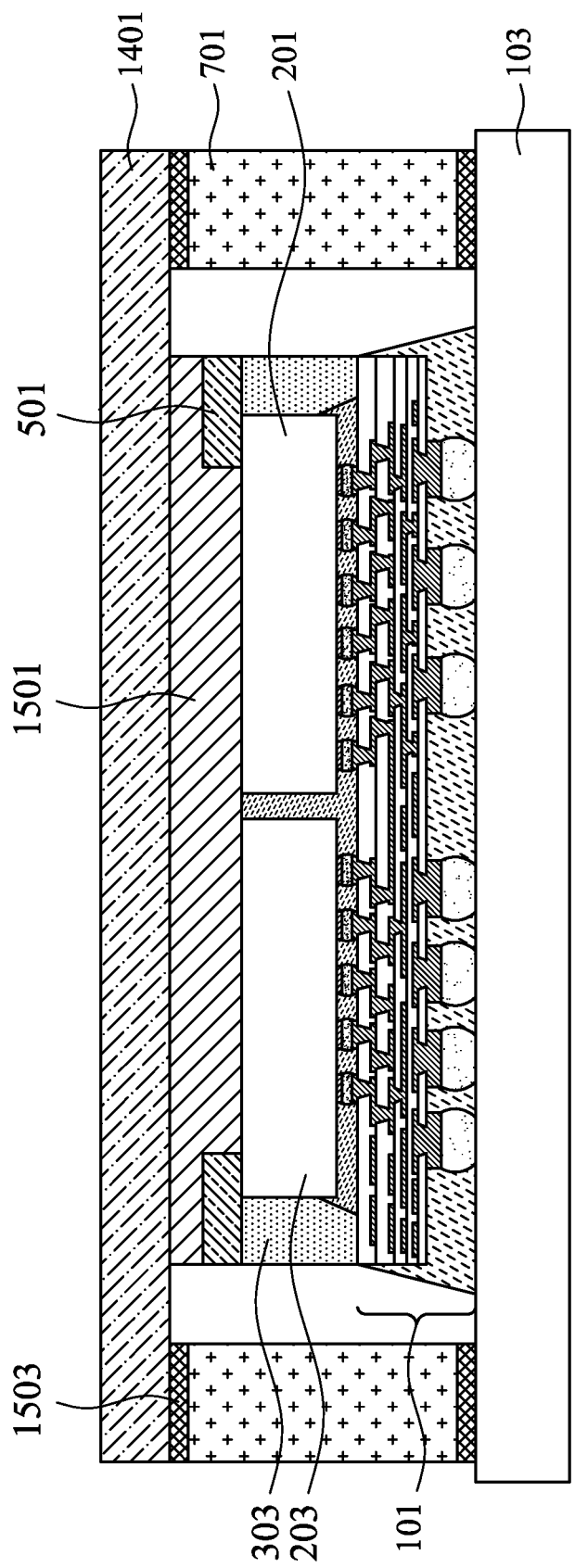
FIG. 15 illustrates the usage of a thermal interface material, in accordance with some embodiments.

FIG. 15 illustrates a further embodiment in which a thermal interface material 1501 is utilized to bridge the distance between the first semiconductor die 201 and the second semiconductor die 203 and the second lid 1401 and enhance the heat transfer. In an embodiment the thermal interface material 1501 may be a viscous, silicone compound similar to the mechanical properties of a grease or a gel, wherein the thermal interface material 1501 may have a thermal conductivity (i.e., "k value") in Watts per meter-Kelvin (W/mK) of between about 1 W/mK and about 10 W/mK, such as about 4 W/mK, for example. In other embodiments, the thermal interface material 1501 is a metal-based thermal paste containing silver, nickel, or aluminum particles suspended in the silicone grease. In still other embodiments non-electrically conductive, ceramic-based pastes, filled with ceramic powders such as beryllium oxide, aluminum nitride, aluminum oxide, or zinc oxide, may be applied.

In embodiments in which a gel or paste consistency in not desired, instead of being a paste with a consistency similar to gels or greases, the thermal interface material 1501 may instead be a solid material. In this embodiment the thermal interface material 1501 may be a thin sheet of a thermally conductive, solid material that is injected or otherwise placed on the first semiconductor die 201 and the second semiconductor die 203. In a particular embodiment the thermal interface material 1501 that is solid may be a thin sheet of indium, nickel, silver, aluminum, combinations and alloys of these, or the like, or other thermally conductive solid material. Any suitably thermally conductive material may also be utilized, and all such materials and methods of dispensing are fully intended to be included within the scope of the embodiments.

Additionally illustrated in FIG. 15 is the use of an adhesive 1503 in order to adhere the ring 701 to both the second lid 1401 and the substrate 103. In some embodiments the adhesive 1503 is a metal-based thermal paste containing silver, nickel, or aluminum particles suspended in the silicone grease. In other embodiments non-electrically conductive, ceramic-based pastes, filled with ceramic powders such as beryllium oxide, aluminum nitride, aluminum oxide, or zinc oxide, may be applied. In other embodiments, instead of being a paste with a consistency similar to gels or greases, the adhesive 1503 may instead be a solid material. In this embodiment the adhesive 1503 may be a thin sheet of a thermally conductive, solid material. In a particular embodiment the adhesive 1503 that is solid may be a thin sheet of indium, nickel, silver, aluminum, combinations and alloys of these, or the like, or other thermally conductive solid material. Any suitably thermally conductive material may also be utilized, and all such materials are fully intended to be included within the scope of the embodiments.

Figure 16:
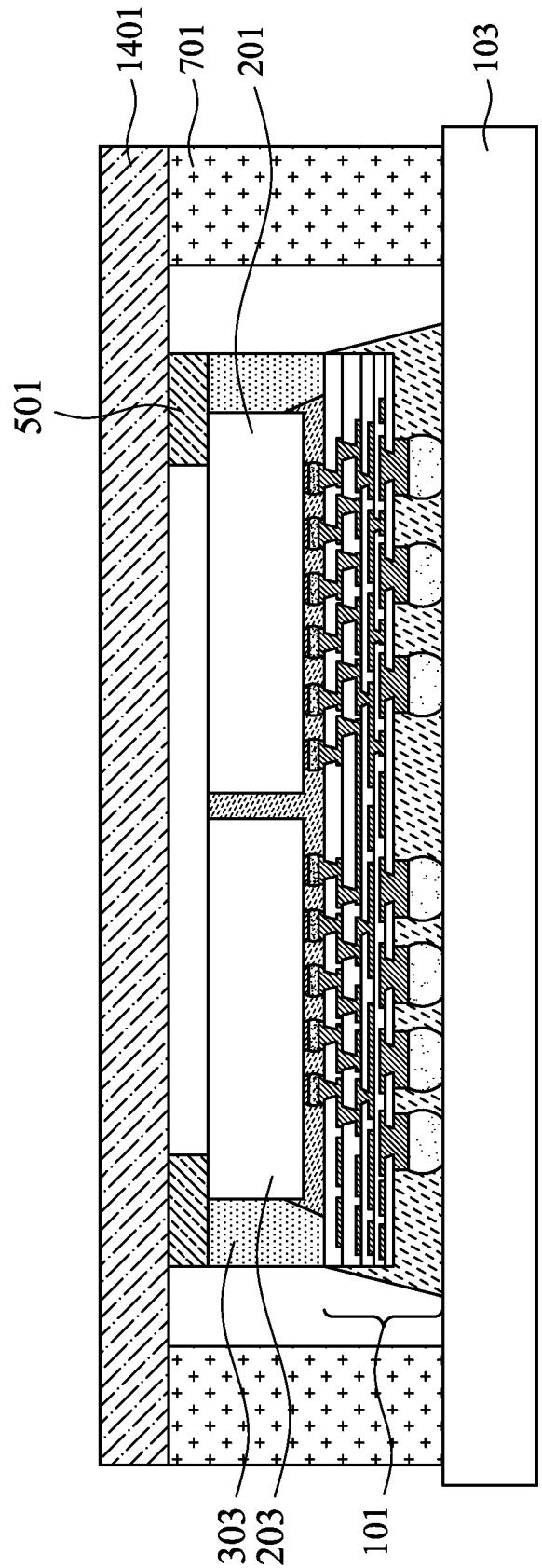
FIG. 16 illustrates an embodiment in which the ring and lids are coplanar, in accordance with some embodiments.

FIG. 16 illustrates yet another embodiment in which the lids 501 are level with the top surfaces of the ring 701. In particular, while previously discussed embodiments may have the top surface of the lids 501 to be at a different height than the ring 701 (e.g., separated by the fourth distance $D_4$ illustrated in FIG. 7A above), in this embodiment the top surface of the lids 501 are at the same height as the top surface of the ring 701. As such, the lids 501 are coplanar with the top surfaces of the ring 701.

FIG. 16 additionally illustrates the placement of the second lid 1401 onto the ring 701 as described above with respect to FIG. 14. In this embodiment, however, because the lids 501 are coplanar with the ring 701, the second lid 1401 is also in physical contact with the lids 501. As such, when the second lid 1401 is sealed to the ring 701, the second lid 1401 is additionally sealed to the lids 501.

Figure 17:
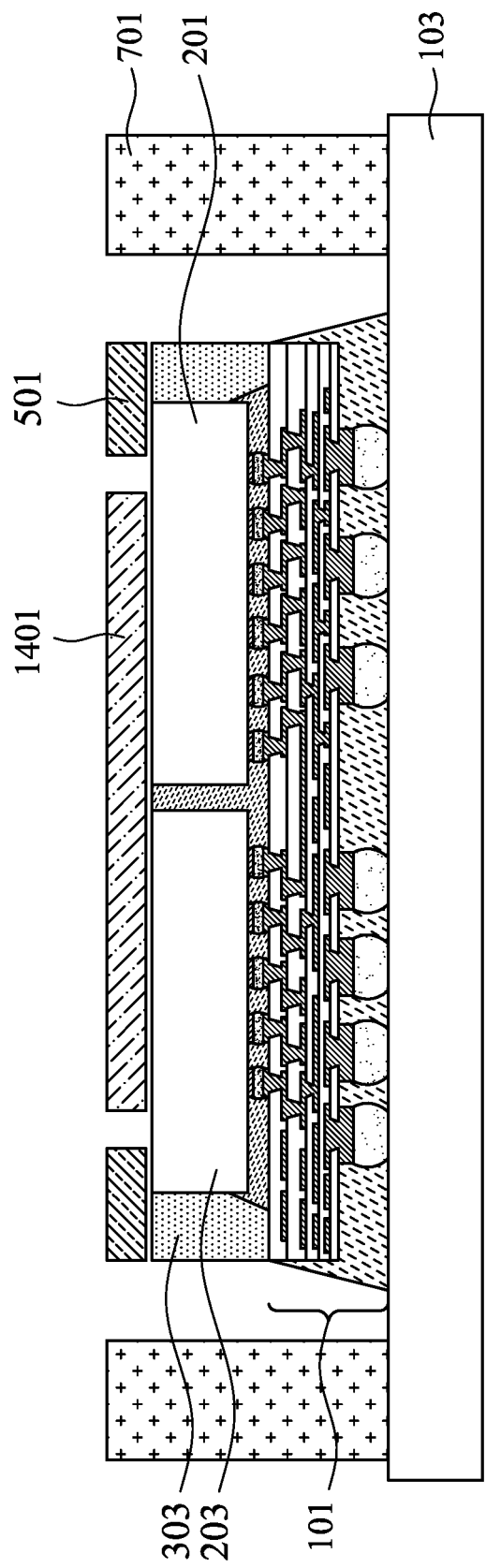
FIG. 17 illustrates an embodiment in which the lid is placed on the first semiconductor die, in accordance with some embodiments.

FIG. 17 illustrates yet another embodiment in which the second lid 1401 is utilized. In this embodiment, however, instead of adhering the second lid 1401 over the ring 701 and the lids 501, the second lid 1401 is adhered to the first semiconductor die 201 and the second semiconductor die 203 in order to help increase heat dissipation from the first semiconductor die 201 and the second semiconductor die 203. In this embodiment the second lid 1401 may be adhered using an adhesive (not separately illustrated in FIG. 17) or using a heat clamping method as described above. However, any suitable method may be used to adhere the second lid 1401.

In this embodiment, however, because the second lid 1401 is bonded to the first semiconductor die 201 and the second semiconductor die 203, the second lid 1401 is sized to fit between the lids 501, which are also attached to the first semiconductor die 201 and the second semiconductor die 203. However, any suitable dimensions may be utilized.

By utilizing the lids 501 as described above, stress that occurs at the corners of the encapsulant 303 can be reduced or eliminated. In particular, because the coefficient of thermal expansion (CTE) of the lids 501 (e.g., metal) are less than the CTE of the encapsulant 303 (e.g., polymer), the expansion of the encapsulant 303 will be suppressed by the lids 501 when heating occurs. With such a reduction in stress, cracks and delamination can be further reduced, allowing for a larger yield during the manufacturing process.

In accordance with an embodiment, a semiconductor device includes: a first semiconductor die connected to an interposer; an encapsulant encapsulating the first semiconductor die; and a first lid in physical contact with both the first semiconductor die and the encapsulant, the first lid crossing an interface between the first semiconductor die and the encapsulant. In an embodiment the semiconductor device further includes a second lid in physical contact with a second semiconductor die and the encapsulant, the second semiconductor die being different from the first semiconductor die and the second lid being located in a different corner of the encapsulant than the first lid. In an embodiment, the semiconductor device further includes a substrate bonded to the interposer. In an embodiment, the semiconductor device further includes a ring attached to the substrate. In an embodiment, the first lid comprises a metal. In an embodiment, the first lid is square shaped. In an embodiment, the first lid is triangle shaped.

In accordance with another embodiment, a semiconductor device includes: an interposer; an encapsulant over the interposer; and a first island material supporting both the encapsulant and a first semiconductor die, the first island material being located in a first corner of the encapsulant, wherein the first island material, the encapsulant, and the first semiconductor die share a first single interface. In an embodiment the first island material comprises a metal. In an embodiment the semiconductor device further includes a second island material supporting both the encapsulant and the first semiconductor die, the second island material being separated from the first island material. In an embodiment the semiconductor device further includes a ring separated from the encapsulant. In an embodiment the interposer is bonded to a substrate. In an embodiment the semiconductor device further includes a second semiconductor die embedded within the encapsulant.

In accordance with yet another embodiment, a method of manufacturing a semiconductor device, the method includes: bonding a first semiconductor device to an interposer; encapsulating the first semiconductor device with an encapsulant to form a first surface, the first surface comprising the encapsulant and the first semiconductor device; bonding a first lid to a first corner of the first surface; and bonding a second lid to a second corner of the first surface, the second corner being different from the first corner. In an embodiment, the bonding the second lid bonds a metal. In an embodiment, the encapsulating the first semiconductor device encapsulates a second semiconductor device with the first semiconductor device, the first surface further comprising the second semiconductor device. In an embodiment, the method further includes bonding a third lid to a third corner of the first surface. In an embodiment, the method further includes: placing a ring around the encapsulant; and annealing the encapsulant between the placing the ring and bonding the first lid. In an embodiment, the method further includes: placing a ring around the encapsulant; and annealing the encapsulant after the placing the ring and the bonding the first lid, wherein there is no annealing between the placing the ring and the bonding the first lid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first semiconductor device bonded to an interposer;
an encapsulant encapsulating the first semiconductor device, wherein a first surface comprises the encapsulant and the first semiconductor device;
a first lid bonded to a first corner of the first surface;
a second lid bonded to a second corner of the first surface, the second corner being different from the first corner; and
a ring located around the encapsulant.

2. The semiconductor device of claim 1, wherein the first lid is circular.

3. The semiconductor device of claim 1, wherein the first lid is triangular.

4. The semiconductor device of claim 1, wherein the first lid has five sides.

5. The semiconductor device of claim 1, wherein the first lid has six sides.

6. The semiconductor device of claim 1, wherein the first lid is aligned with at least two sides of the encapsulant.

7. The semiconductor device of claim 1, wherein the first semiconductor device is a system-on-chip device.

8. A semiconductor device comprising:
a ring surrounding a first region over a substrate;
an interposer located on the substrate in the first region;
a first semiconductor device on the interposer;
a second semiconductor device on the interposer;
an encapsulant encapsulating the first semiconductor device and the second semiconductor device; and
a plurality of lids, each one of the plurality of lids located at a respective corner of the encapsulant.

9. The semiconductor device of claim 8, wherein the ring is equidistantly separated from the encapsulant on each side of the encapsulant.

10. The semiconductor device of claim 8, wherein the ring is separated from the encapsulant a first distance adjacent to a first side of the encapsulant and is separated from the encapsulant a second distance adjacent to a second side of the encapsulant, the first distance being different from the second distance.

11. The semiconductor device of claim 8, further comprising a first underfill between the first semiconductor device and the interposer.

12. The semiconductor device of claim 11, wherein the first underfill extends to a region between the first semiconductor device and the second semiconductor device.

13. The semiconductor device of claim 12, wherein the first underfill completely fills the region between the first semiconductor device and the second semiconductor device.

14. The semiconductor device of claim 8, wherein the plurality of lids comprises stainless steel.

15. A semiconductor device comprising:
an encapsulant encapsulating a first semiconductor device and a second semiconductor device;
an interposer located on a first side of the encapsulant;
a first lid and a second lid located on an opposite side of the encapsulant from the interposer, wherein the first lid is separate from the second lid, and wherein the first lid is in physical contact with both the first semiconductor device and the encapsulant; and
a ring surrounding the encapsulant.

16. The semiconductor device of claim 15, wherein the first lid has a first overlap length of between about 2 mm and about 3 mm.

17. The semiconductor device of claim 16, wherein the first lid has a first overlap width of between about 2 mm and about 3 mm.

18. The semiconductor device of claim 15, further comprising a thermal interface material located between the first lid and the second lid.

19. The semiconductor device of claim 18, wherein the thermal interface material extends away from the first lid to be in physical contact with a third lid.

20. The semiconductor device of claim 15, wherein the first lid comprises at least one straight side and at least one curved side.

* * * * *